(12) United States Patent
LaBosco et al.

(10) Patent No.: US 9,549,256 B2
(45) Date of Patent: Jan. 17, 2017

(54) SPEAKER PROTECTION FOR SURROUND SOUND SYSTEMS

(71) Applicant: Crestron Electronics, Inc., Rockleigh, NJ (US)

(72) Inventors: Mark LaBosco, New City, NY (US); David Burke, New York, NY (US); Alexander Marra, Ridgwood, NJ (US)

(73) Assignee: CRESTRON ELECTRONICS, INC., Rockleigh, NJ (US)

( * ) Notice: Subject to any disclaimer, the term of this patent is extended or adjusted under 35 U.S.C. 154(b) by 72 days.

(21) Appl. No.: 14/615,180

(22) Filed: Feb. 5, 2015

(65) Prior Publication Data

US 2016/0234596 A1    Aug. 11, 2016

Related U.S. Application Data

(60) Provisional application No. 61/937,299, filed on Feb. 7, 2014.

(51) Int. Cl.
*H03G 11/00* (2006.01)
*H04R 3/00* (2006.01)
*H04N 5/60* (2006.01)
*H03G 7/00* (2006.01)

(52) U.S. Cl.
CPC .............. *H04R 3/007* (2013.01); *H03G 7/002* (2013.01); *H04N 5/602* (2013.01); *H04N 5/607* (2013.01); *H04R 2430/01* (2013.01)

(58) Field of Classification Search
CPC ..... H04R 3/007; H04R 2430/01; H03G 7/002; H04N 5/602; H04N 5/607
See application file for complete search history.

(56) References Cited

U.S. PATENT DOCUMENTS

| | | | |
|---|---|---|---|
| 2013/0136278 A1* | 5/2013 | Quilter | G10H 3/187 381/118 |
| 2013/0216049 A1* | 8/2013 | Wolf | H04R 1/00 381/55 |
| 2014/0037097 A1* | 2/2014 | LaBosco | H04R 29/001 381/59 |
| 2014/0112484 A1* | 4/2014 | Britt, Jr. | H04R 29/001 381/59 |

* cited by examiner

*Primary Examiner* — Regina N Holder
(74) *Attorney, Agent, or Firm* — Crestron Electronics, Inc

(57) ABSTRACT

An audio/video receiver configured to limit the power delivered to its speakers based on real time calculations. First, power delivered to the speakers is limited to the power rating of the speakers during short durations. Second, a secondary longer time constant Root-Mean-Square (RMS) detector limits sustained power to the speakers for a predetermined fraction of the peak power rating.

8 Claims, 1 Drawing Sheet

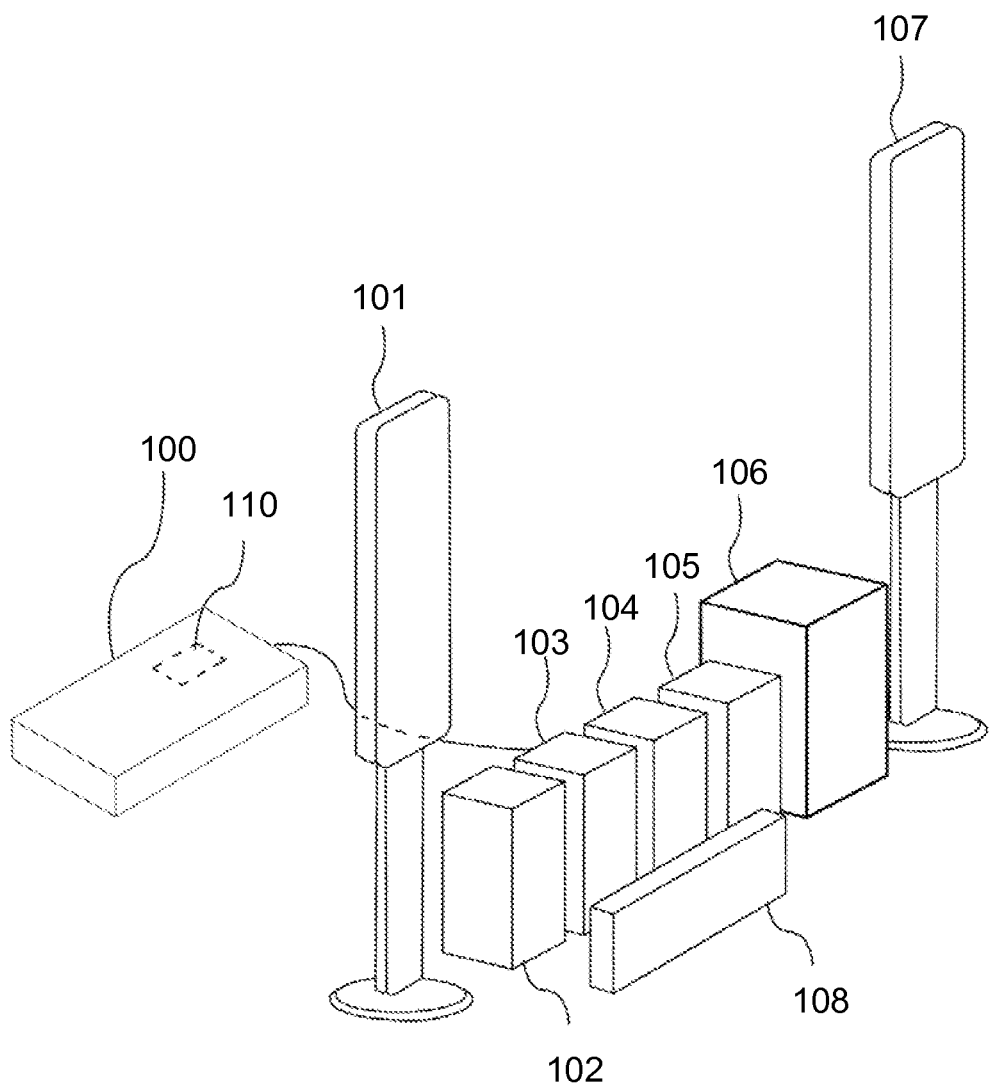

SPEAKER PROTECTION FOR SURROUND SOUND SYSTEMS

BACKGROUND OF THE INVENTION

Technical Field

This present invention provides a system and method for protecting audio speakers, and more specifically, one that prevents the speakers from getting damaged regardless of audio content and user settings.

Background

The dynamic range of audio content intended to be used with a surround sound system can lead to damage to speakers when played at high volumes. In addition, the typical surround sound system is constructed with an audio amplifier that provides the same available power to all speakers while most systems have a mixture of large and small speakers.

A common configuration for actual surround sound installation may involve, for example, a pair of large floor standing front speakers, one located to the left and right of a display, a smaller center channel speaker located above the display, one located below or behind the display screen, and a number of small satellite speakers for surround and back channels.

Typically, the power handling capability of any large front speaker is usually significantly higher than the power handling capability of any center channel and surround channel. However, it is typical for amplifiers used for this application provide identical power to all of these speakers. As a result, this can lead to over driving the smaller speakers, for example, during playback intense audio action sequences. Moreover, most speakers are rated for short term power usage and cannot sustain operation continuously at this power rating. Likewise, if an end user operates a system at excessive volume settings, speaker coils may become damaged, for example, through overheating.

A typical home theater uses an A/V receiver is a device that provides an input selector switch, a surround sound decoder, a volume control function, and a power amplifier to drive speakers. With the latest high definition audio formats provided by BlueRay players, a powerful Digital Signal Processor (DSP) is necessary to decode and process surround sound content. Normally, additional signal processing is required to perform post processing such as bass management, dynamic range processing, and equalization.

Typically, dynamic range processing is usually limited to providing a "midnight mode" to reduce the dynamic range of the signals so that any on-screen transients (like gun shots and explosions) don't wake up the neighbors. However, this type of processing is not intended to protect the speakers and can even increase the likelihood of thermal damage. Since the peak power gets limited in midnight mode, the end user does not hear the undesirable sounds like clipping and short term speaker overload that would normally trigger the user to turn the volume down. Instead the speaker continues to heat up until the point of failure.

There is a desire to prevent damage to audio speakers. Accordingly, there is a need for an improved speaker protection for surround sound systems, devices and methods.

SUMMARY OF THE INVENTION

It is to be understood that both the general and detailed descriptions that follow are exemplary and explanatory only and are not restrictive of the invention.

The instant invention provides a system and method of installing an audio system that prevents the speakers from getting damaged regardless of the audio content and user settings.

According to one aspect, during the initial installation of a surround sound system, the installer may program certain parameters related to the location of all audio speakers. These parameters may include, among others, the crossover frequency used for bass management, the distance from the primary seating position, and a volume trim that balances the Sound pressure level (SPL) level for each speaker at this seating position.

In other aspect, the installer may enter two additional parameters related to the speakers used. Specifically, the impedance of the speakers used; and the power rating of the speakers used.

Audio speakers may be deployed in groups of similar types in addition to utilizing differently sized speakers (e.g. front, center, surround, and back.)

In an Audio-Video Receiver (AVR), the gain of the built in amplifier is normally known, therefore the power delivered to the speakers can be calculated using several parameters including the digital signal level input to the Digital to Analog Converter (DAC) converter, the analog volume control gain which is in between the DAC and the power amplifier and the gain of the power amplifier. Accordingly, a DSP can be configured to limit the power delivered to the speakers based on these calculations in real time.

The present invention seeks to overcome or at least ameliorate one or more of several problems, including but not limited to, mitigating audio speaker damage regardless of audio content and user settings. Additional aspects and advantages of the invention will be set forth in part in the description which follows and, in part, will be obvious from the description, or may be learned by practice of the invention.

BRIEF DESCRIPTION OF THE DRAWINGS

The accompanying figures further illustrate the present invention. The components in the drawings are not necessarily drawn to scale, emphasis instead being placed upon clearly illustrating the principles of the present invention. In the drawings, like reference numerals designate corresponding parts throughout the several views.

BRIEF DESCRIPTION OF THE SEVERAL VIEWS OF THE DRAWINGS

FIG. 1 shows a block schematic of an A/V system according to an embodiment of the present invention.

DETAILED DESCRIPTION OF THE INVENTION

The present invention advantageously utilizes a speaker protection module to protect one or more audio output devices.

Mode(s) for Carrying Out the Invention

The disclosed speaker protection module may be generally practiced with a diversity of Audio/Video receivers, and is particularly well suited in a hardware AVR having a surround sound DSP processor. However, any reference to use of a specific type of AVR is provided by way of example and is not intended to limit the practice of the invention.

There are two mechanisms that tend to damage speakers. The first is mechanically induced damage caused by excessive excursion of the speaker. This type of failure is caused by over-powering the speaker, even for a short duration.

The second mechanism that damages speakers is thermal related. Excessive power for an extended period can cause various failure modes such as melting of the voice coil. The thermal failure mode can happen at power levels well below the speaker rating if applied over time.

In one embodiment, a dual action protection system is deployed where the peak power delivered to the speaker is limited to the power rating of the speaker for short durations and then a secondary longer time constant Root-Mean-Square (RMS) detector limits the sustained power to the speaker is limited to a predetermined fraction of the peak power rating to prevent heat related failures.

Referring to FIG. 1, shows an exemplary surround sound setup suitable for use with an embodiment of the present invention. An Audio/Video Receiver (AVR) 1 includes a speaker protection module implemented in a digital signal processor (DSP) 110 for protecting one or more audio speakers 101-108. As would be understood by one skilled in the art, the number, location and configuration of speakers 101-108 shown in FIG. 1 are purely exemplary and may be varied.

Each speaker 101-108 is connected to AVR 1 through either a wired connection or a wireless connection. The wired connection may be analog or digital. The wired connection may utilize a standard protocol such as, for example, Universal Serial Bus (USB), Ethernet, RS232, RS422, and can optionally also carry power using, for example, USB or Power-Over-Ethernet (POE). The wireless connection may include but is not limited to ultrasound, radio frequency (RF), ultra high frequency (UHF), and/or infrared (IR). Optionally, the wireless connection may utilize a standard protocol such as, for example, Bluetooth®, WiFi, Zigbee®, and/or Digital Enhanced Cordless Telecommunications (DECT).

Moreover, some or all of the speaker protection module functionality described herein as being associated implemented in digital signal processor (DSP) 110 could be implemented using another component or a combination of components in addition to, or instead of DSP 110, including but not limited to one or more personal computers (PCs), decoders, and/or sound processors.

In order to calibrate the speaker protection module for speakers 101-108, a user (typically an audio system installer) designates values for the parameters used by the speaker protection module to calculate the speaker protection settings. Parameter values can be designated, for example, using any mobile computing device running graphically based commissioning software toolbox operative to communicate the aforementioned parameter values to AVR 1.

In the preferred embodiment, the speaker protection module parameters include: speaker impedance; maximum speaker power; amplifier gain, and maximum DAC output voltage. Initially, the speaker protection module of the AVR 1 has to determine the threshold (i.e. the maximum voltage level that the speakers 101-108 can sustain.

The maximum output voltage of the system is calculated using:

$$\text{Output}_{(max\ voltage)} = \text{DAC}_{(max\ voltage)} \times \text{Amplifier Gain}_{(dB)}$$

The maximum voltage that the speaker can accept can be calculated using the rated speaker power and the speaker impedance, the $$\text{Speaker}_{(max\ voltage)} = \sqrt{\text{Speaker}_{(rated\ power)} \times \text{Speaker}_{(impedance)}}$$

The threshold is calculated by finding the ratio of max speaker voltage to max output voltage:

$$\text{Threshold} = \sqrt{\frac{\text{Speaker}_{(max\ voltage)}}{\text{output}_{(max\ voltage)}}}$$

The threshold is the fraction of full scale output that the speaker can sustain without failure. This number must be translated to a digital number for the DSP 110. The maximum level inside the DSP 110 is called the full scale. This is represented in dB as dBFS and will map to the maximum output voltage at the output of the amp.

$$\text{Threshold}_{(dBFS)} = 20 \times \log\left(\frac{\text{Speaker}_{(max\ voltage)}}{\text{Output}_{(max\ voltage)}}\right)$$

The value of threshold is programmed into the DSP 110. The DSP 110 then limits the output voltage to this level, thus protecting speaker 101-108. The speaker protection module prevents the amplifier from clipping and the speaker from overloading which results in better sound quality from the user's perspective. This advantageously prevents amplifiers from shutting down from faults caused by overheating and over current. Furthermore, it does not rely on measuring the voltage and current going into the speaker therefore does not increase the cost of a AVR 1 assuming there is enough spare DSP processing power in the unit. The operation of this speaker protector works regardless of the content played and user volume, tone control and equalization settings. The end result is a system that is very difficult to damage.

The gain of the amplifier can be entered during the setup process for systems that have separate components implementing the surround processor and power amplifier. The gain information may be found, for example, in the amplifier's manual. Passive subwoofers can be protected using the same mechanisms since they would have a power rating and known amplifier. Powered subwoofers could be protected using the same mechanisms if the end user knows the subwoofers power limitations or the gain setting for a particular knob position.

Yet another embodiment, a preconfigured surround sound package that includes the processor and speakers can be sold with all the speaker parameters configured in the system.

Yet in other embodiments, a microphone based calibration can be utilized by the end user instead of having to enter any parameters. In these embodiments, the user only has to position the microphone in the primary listening position and initiate the calibration process.

List of Acronyms Used

The following is a list of the acronyms used in the specification.

DSP Digital Signal Processor
RMS Root-Mean-Square
NV Audio/Video
DAC Digital to Analog Converter
SPL Sound pressure level
ASIC Application-Specific Integrated Circuit
FPGA Field-Programmable Gate Array ROM Read Only Memory
RAM Random Access Memory
PC Personal Computer
AVR Audio-Video Receiver
RF Radio Frequency
USB Universal Serial Bus
POE Power-Over-Ethernet
UHF Ultra High Frequency
DECT Digital Enhanced Cordless Telecommunications
IR Infra-Red In this description, various functions and operations may be encoded and performed by a hardware processor, (e.g. a microprocessor.) Alternatively, or in combination, the functions and operations can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

At least some aspects disclosed can be embodied, at least in part, in physically tangible firmware. That is, the techniques may be carried out in a computer system or other data processing system in response to its processor, such as a microprocessor, executing sequences of instructions contained in a memory, such as ROM, volatile RAM, non-volatile memory, cache or a remote storage device.

Alternate Embodiments

Alternate embodiments may be devised without departing from the spirit or the scope of the invention. For example, the present invention is not limited to specific sound systems (e.g. surround sound systems,) and could be used in other applications including speakers under rated for the given amplifier power rating, or applications that require the use of a mixture of speakers of different sizes.

What is claimed is:

1. An audio-video system for providing audio content to one or more speakers from an audio-video receiver, the audio-video receiver comprising:
    an amplifier;
    a digital-to-analog converter; and
    a Digital Signal Processor adapted to limit a peak power delivered to the one or more speakers according to predefined calibration parameters, the predefined calibration parameters comprising;
        a maximum power of the one or more speakers;
        an impedance of the one or more speakers;
        an amplifier gain of the amplifier; and
        a maximum output voltage of the digital-to-analog converter.

2. The audio-video system of claim 1, wherein the one or more speakers are surround speakers.

3. The audio-video system of claim 1, wherein the amplifier is a multi-channel amplifier.

4. The audio-video system of claim 1, wherein the calibration parameters further comprises:
    a predefined duration, whereby the Digital Signal Processor further limits the peak power delivered to the one or more speakers according to the predefined duration.

5. The audio-video system of claim 4, wherein the audio-video receiver further comprises:
    a memory adapted to store the calibration parameters specific to the one or more speakers, wherein the audio content is limited based at least in part on the calibration parameters.

6. An audio-video system for preventing damage to one of more audio speaker coils of one or more surround speakers, the audio-video system comprising:
    a memory adapted to store a volume trim that balances a sound pressure level of the one or more surround speakers, an impedance of the the one or more surround speakers, and a power rating of the surround speakers;
    an audio-video receiver;
    a multi-channel amplifier;
    a digital-to-analog converter; and
    a digital signal processor adapted to limit a peak power delivered to the one or more surround speakers.

7. The system of claim 6, wherein
    the memory stores a predefined limiting duration for the digital signal processor to further limit the peak power delivered to the one or more surround speakers according to the predefined limiting duration.

8. The system of claim 7, further comprising:
    a mobile computing device running a graphically based commissioning software for communicating the volume trim, the impedance, the the power rating, the peak power, and the predefined limiting duration to the audio-video receiver.

* * * * *